(12) United States Patent
Le et al.

(10) Patent No.: US 6,731,542 B1
(45) Date of Patent: May 4, 2004

(54) CIRCUIT FOR ACCURATE MEMORY READ OPERATIONS

(75) Inventors: Binh Q. Le, San Jose, CA (US); Michael Achter, Sunnyvale, CA (US); Lee Cleveland, Santa Clara, CA (US); Chen Pauling, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/313,444

(22) Filed: Dec. 5, 2002

(51) Int. Cl.[7] .......................... G11C 16/06; G11C 16/04
(52) U.S. Cl. ........................... 365/185.21; 365/185.03; 365/185.25
(58) Field of Search .................... 365/185.03, 185.21, 365/185.25

(56) References Cited

U.S. PATENT DOCUMENTS

| | | | | |
|---|---|---|---|---|
| 5,400,276 A | * | 3/1995 | Takeguchi | 365/185.12 |
| 6,496,405 B2 | * | 12/2002 | Hibino | 365/104 |
| 6,510,082 B1 | * | 1/2003 | Le et al. | 365/185.16 |
| 6,529,412 B1 | * | 3/2003 | Chen et al. | 365/185.21 |
| 6,532,176 B1 | * | 3/2003 | Kushnarenko | 365/185.25 |

OTHER PUBLICATIONS

Tsao et al., "A 5V–Only 16M Flash Memory Using a Contactless Array of Source–Side Injection Cells," 1995 Symposium on VLSI Circuits, IEEE, New York, Jun. 8, 1995, p. 77–78.

* cited by examiner

*Primary Examiner*—Son Mai
(74) *Attorney, Agent, or Firm*—Farjami & Farjami LLP

(57) ABSTRACT

A memory circuit arrangement for sensing current in a target cell during a read operation is disclosed. According to one exemplary embodiment, the memory circuit arrangement comprises the target cell and a first neighboring cell adjacent to the target cell. The first target cell has a first bit line connected to ground; the target cell also has a second bit line connected to a sensing circuit. The first neighboring cell shares the second bit line with the target cell; the first neighboring cell also has a third bit line connected to the sensing circuit during the read operation. The memory circuit arrangement results in increased error margins in a fast and accurate manner during the read operation of the target cell.

20 Claims, 5 Drawing Sheets

CIRCUIT FOR ACCURATE MEMORY READ OPERATIONS

TECHNICAL FIELD

The present invention relates generally to the field of semiconductor devices. More particularly, the present invention relates to semiconductor memory devices.

BACKGROUND ART

Memory devices are known in the art for storing data in a wide variety of electronic devices and applications. Electronic memory, for example, is widely used in a variety of commercial and consumer electronic products. A typical memory device comprises a plurality of memory cells. Often, memory cells are arranged in an array format, where a row of memory cells corresponds to a word line and a column of memory cells corresponds to a bit line, and where each memory cell defines a binary bit, i.e., either a zero ("0") bit or a one ("1") bit. For example, a memory cell may be defined as either being a "programmed" cell or an "erased" cell. According to one particular convention, a programmed cell is representative of a "0" bit, and an erased cell is representative of a "1" bit. In one type of memory cell, each cell stores two binary bits, a "left bit" and a "right bit." The left bit can represent a "0" or a "1" while the right bit can represent a "0" or a "1" independent of the left bit.

Typically, the state of a memory cell is determined during a read operation by sensing the current drawn by the memory cell. For example, to ascertain the current drawn by a particular memory cell, the drain terminal of the memory cell is connected to a sensing circuit, the source terminal of the memory cell is connected to ground, and the gate of the memory cell is selected. The sensing circuit attempts to detect the current drawn by the memory cell, and compares the sensed memory cell current against a reference current. If the sensed memory cell current exceeds the reference current, the memory cell is considered an erased cell (corresponding to a "1" bit). However, if the sensed memory cell current is below the reference current, the memory cell is considered a programmed cell (corresponding to a "0" bit).

In practice, it is desirable to have the sensed memory cell current be greater than or less than the reference current by an error margin. With an error margin, the impact of extraneous factors, such as noise, for example, upon the detection of the memory cell current is reduced. For instance, suppose the reference current used for comparison is fifteen (15) microAmps ($\mu$A) in a particular memory device. In this case, it would be desirable to sense a memory cell current of twenty (20) $\mu$A or greater for an erased cell (corresponding to a "1" bit) and a memory cell current of ten (10) $\mu$A or less for a programmed cell (corresponding to a "0" bit). With a five (5) $\mu$A error margin, the impact of factors, such as noise, is significantly reduced.

Conventional memory read circuits, however, considerably reduce the error margin for sensing memory cell current during read operations. When the error margin is significantly reduced, the reliability of sensing the memory cell current also decreases, since factors, such as noise, have a greater impact. The reliability of the read operation is thus reduced resulting in poor performance of the memory device. Accordingly, there exists a strong need in the art to overcome deficiencies of known memory read circuits and to provide a memory read circuit and technique which results in increased error margins in a fast and accurate manner during memory read operations.

SUMMARY

The present invention is directed to circuit for accurate memory read operations. The invention addresses and resolves the need in the art for a memory circuit arrangement which results in increased error margins in a fast and accurate manner during memory read operations. According to one exemplary embodiment, the memory circuit arrangement for sensing current in a target cell during a read operation comprises the target cell and a first neighboring cell adjacent to the target cell. In the exemplary embodiment, the target cell has a first bit line connected to ground; the target cell also has a second bit line connected to a sensing circuit. The first neighboring cell shares the second bit line with the target cell, and further has a third bit line connected to the sensing circuit. Each of the target cell and the first neighboring cell comprises a respective gate terminal connected to a common word line. In some embodiments, the target cell may also store a first bit and a second bit.

According to another exemplary embodiment, the memory circuit arrangement further comprises a second neighboring cell adjacent to the first neighboring cell. In this particular embodiment, the second neighboring cell shares the third bit line with the first neighboring cell, and further has a fourth bit line connected to a precharge circuit during the read operation. Each of the target cell, the first neighboring cell, and the second neighboring cell comprises a respective gate terminal connected to a common word line.

According to another exemplary embodiment, the memory circuit arrangement further comprises a third neighboring cell adjacent to the second neighboring cell. In this particular embodiment, the third neighboring cell shares the fourth bit line with the second neighboring cell, and further has a fifth bit line connected to the precharge circuit during the read operation. Each of the target cell, the first neighboring cell, the second neighboring cell, and the third neighboring cell comprises a respective gate terminal connected to a common word line.

Other features and advantages of the present invention will become more readily apparent to those of ordinary skill in the art after reviewing the following detailed description and accompanying drawings.

DETAILED DESCRIPTION OF THE INVENTION

The present invention is directed to a circuit for accurate memory read operations. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. In the description that follows, references will be made to one particular convention where a programmed state is representative of a "0" bit, and an erased state is representative of a "1" bit, although the present invention is also suitable for use with alternative conventions.

Figure 1A:
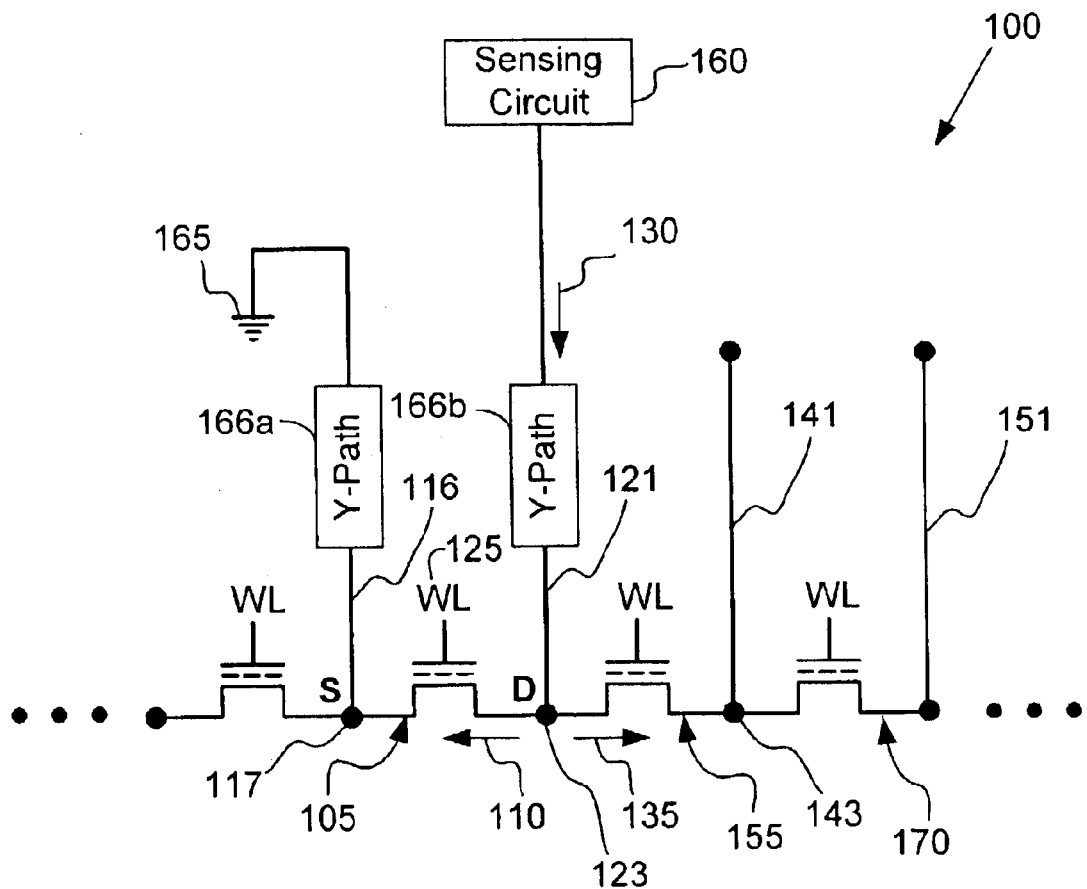
FIG. 1A depicts a circuit schematic of a known memory circuit arrangement.
Figure 1B:
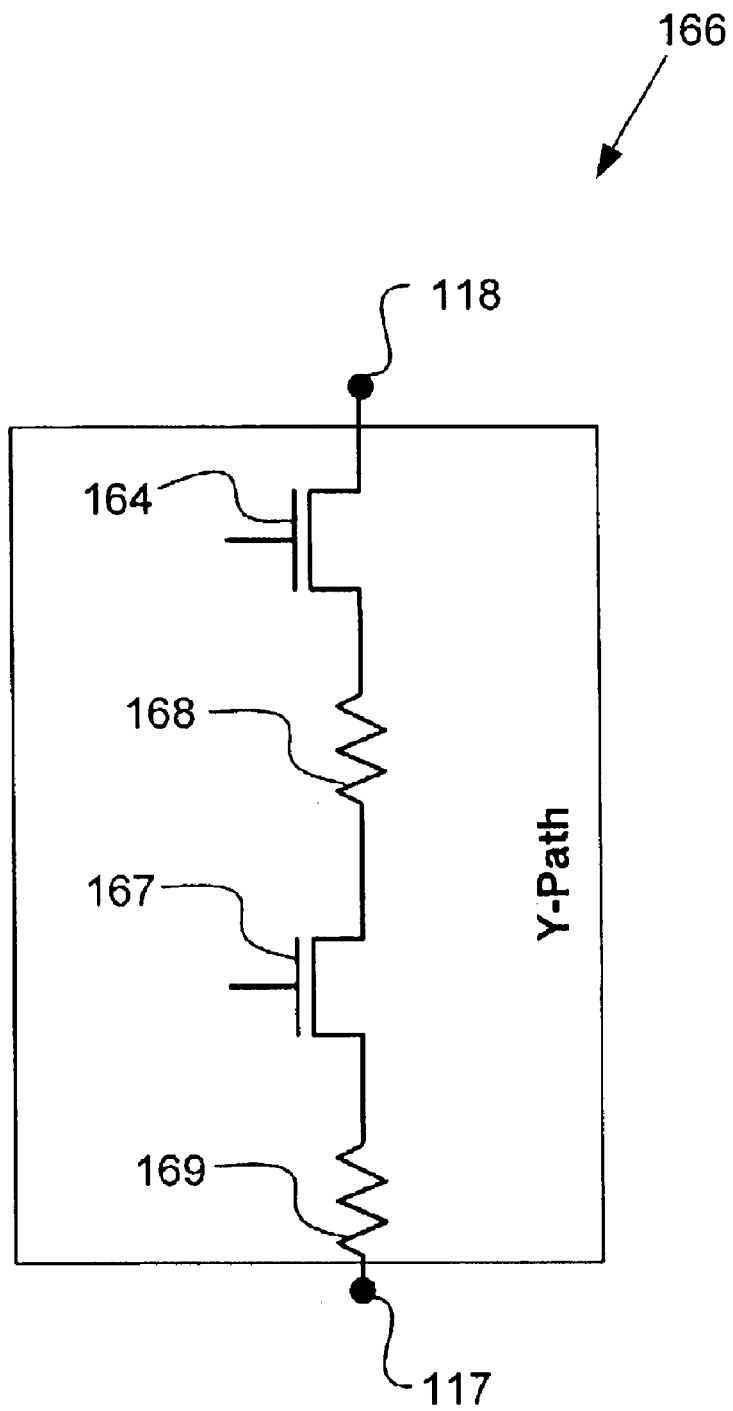
FIG. 1B depicts a simplified Y-decoder or Y-select path, designated as Y-Path.
Figure 2:
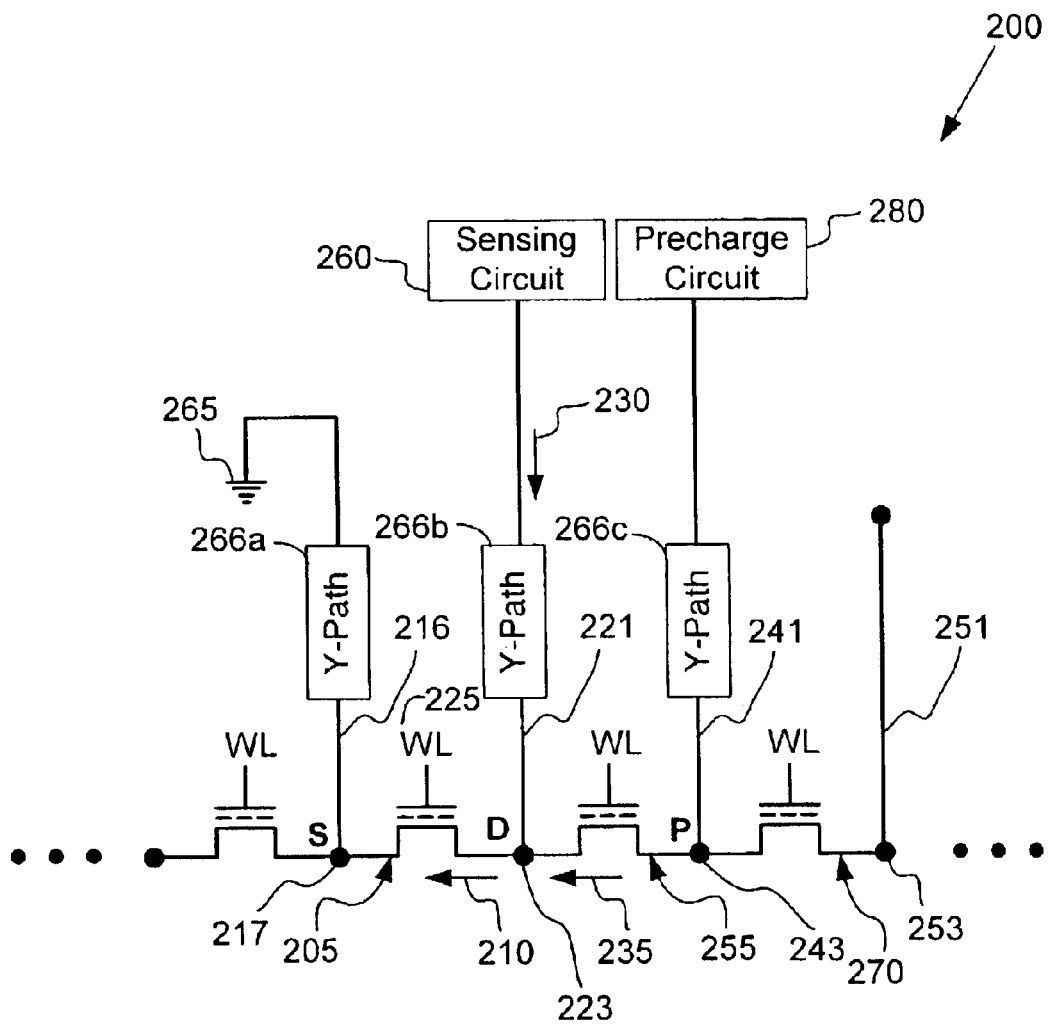
FIG. 2 depicts a circuit schematic of another known memory circuit arrangement.

To illustrate the features and advantages of the present invention, a brief description of known memory circuit arrangements is provided with reference to FIGS. 1A, 1B and 2. Referring first to FIG. 1A, there is shown known memory circuit arrangement 100 corresponding lo a portion, of a memory device. In circuit arrangement 100, bit lines 116 and 121 are connected through a selection circuit, generally shown as Y-Paths 166a and 166b, in a manner so as to sense memory cell current 110 drawn by memory cell 105. This arrangement may be implemented when a read operation involving memory cell 105 is to be performed. Y-Paths 166a and 166b establish connections for bit lines 116 and 121, respectively, in circuit arrangement 100 and can, for brevity, be represented by simplified Y-Path 166 as shown in FIG. 1B. FIG. 1B depicts a simplified "Y-decoder" or "Y-select path," referred to simply as "Y-Path" 166. In FIG. 1B, Y-Path 166 provides a connection between node 117 and node 118 through resistor 169, transistor 167, resistor 168, and transistor 164, when both transistors 167 and 164 are activated, e.g., by providing activation signals to respective gates of transistors 167 and 164. Resistors 168 and 169 represent resistance due to global metal bit lines and diffusion bit line.

Referring back to FIG. 1A, bit line 121 is configured as a "drain" bit line (designated "D" in FIG. 1) by connecting node 123 to sensing circuit 160 through Y-Path 166b. Bit line 116 is configured as a "source" bit line (designated "S" in FIG. 1) by connecting node 117 to ground 165 through Y-Path 166a. Bit lines 141 and 151 are "floating" and may have a pattern-dependant path to ground through the neighboring memory cells. Word line 125 (designated "WL" in FIG. 1) is connected to the gate terminal of memory cell 105 and is utilized to activate memory cell 105. When memory cell 105 is activated, the amount of current 110 drawn by memory cell 105 indicates the "programmed" or "erased" status of memory cell 105. In the present exemplary embodiment, if memory cell 105 is "programmed" (i.e. representing a "0" bit), a low current, for example less 10 $\mu A$, is drawn by memory cell 105. Conversely, if memory cell 105 is "erased" (i.e. representing a "1" bit), a high current, for example greater than 20 $\mu A$, is drawn by memory cell 105.

With memory circuit arrangement 100, sensing circuit 160 senses current 130 in an attempt to ascertain memory cell current 110 through memory cell 105. However, when memory cell 105 is a programmed cell (corresponding to a "0" bit), leakage current 135 from node 123 to node 143 may be drawn when neighboring memory cell 155 and all its neighboring cells between memory cell 155 and ground are erased cells (corresponding to a "1" bit). Also another potential source for leakage current 135 is transient current that could be present for charging some of the bit lines for memory cells situated on the right side of memory cell 155 in FIG. 1A. In this case, current 130 detected by sensing circuit 160 will be the sum of memory cell current 110 and leakage current 135, effectively raising current 130 and reducing the error margin during the read operation when memory cell 105 is a programmed cell. As described above, reducing this error margin during a read operation reduces the reliability of the read operation.

Referring next to FIG. 2, there is shown another known memory circuit arrangement 200 corresponding to a portion of a memory device. Similar to memory circuit arrangement 100 of FIG. 1, bit line 221 of memory cell 205 is configured as a "drain" bit line (designated "D" in FIG. 2) by connecting node 223 to sensing circuit 260 through Y-Path 266b, while bit line 216 is configured as a "source" bit line (designated "S" in FIG. 2) by connecting node 217 to ground 265 through Y-Path 266a, in a manner so as to sense memory cell current 210 drawn by memory cell 205. Word line 225 (designated "WL" in FIG. 2) is connected to the gate terminal of memory cell 205 and is utilized to activate memory cell 205. When memory cell 205 is activated, the amount of current 210 drawn by memory cell 205 indicates the "programmed" or "erased" status of memory cell 205.

In memory circuit arrangement 200, bit line 241 of neighbor cell 255 is configured as a "precharge" bit line (designated "P" in FIG. 2) by connecting node 243 to precharge circuit 280 through Y-Path 266c. Bit line 251 is "floating" and may have a pattern-dependant path to ground through the neighboring memory cells. Y-Path 266a through 266c can be represented by Y-Path 166 as shown in FIG. 1B and described above.

Node 243 connected to bit line 241 is supplied a precharge voltage in an effort to reduce leakage current from node 223 to node 243 when memory cell 205 is a programmed cell (corresponding to a "0" bit) and neighboring memory cell 255 is an erased bit (corresponding to a "1" bit). For example, precharge circuit 280 may provide at node 243 a voltage at about the same level as that provided at node 223 by sensing circuit 260. While supplying a precharge voltage at node 223 may help reduce leakage current from node 223 to node 243 when memory cell 205 is a programmed cell (corresponding to a "0" bit) and neighboring memory cell 255 is an erased cell (corresponding to a "1" bit), leakage current 235 from node 243 to node 223 may occur when memory cell 205 is an erased cell (corresponding to a "1" bit) and neighboring memory cell 255 is an erased cell (corresponding to a "1" bit). The reason is that when memory cell 205 is an erased cell, memory cell current 210 acts to decrease the voltage supplied at node 223 through Y-Path 266b. As a result, the difference in voltage between node 243 and node 223 acts to draw leakage current 235 from node 243 to node 223 through erased memory cell 255. In this case, sensing circuit 260 will sense current, 230 corresponding to the difference between memory cell current 210 and leakage current 235, effectively reducing current 230 when memory cell 205 is an erased cell and thereby reducing the error margin during a read operation. As pointed out above, reducing this error margin during a read operation reduces the reliability of the read operation.

Figure 3:
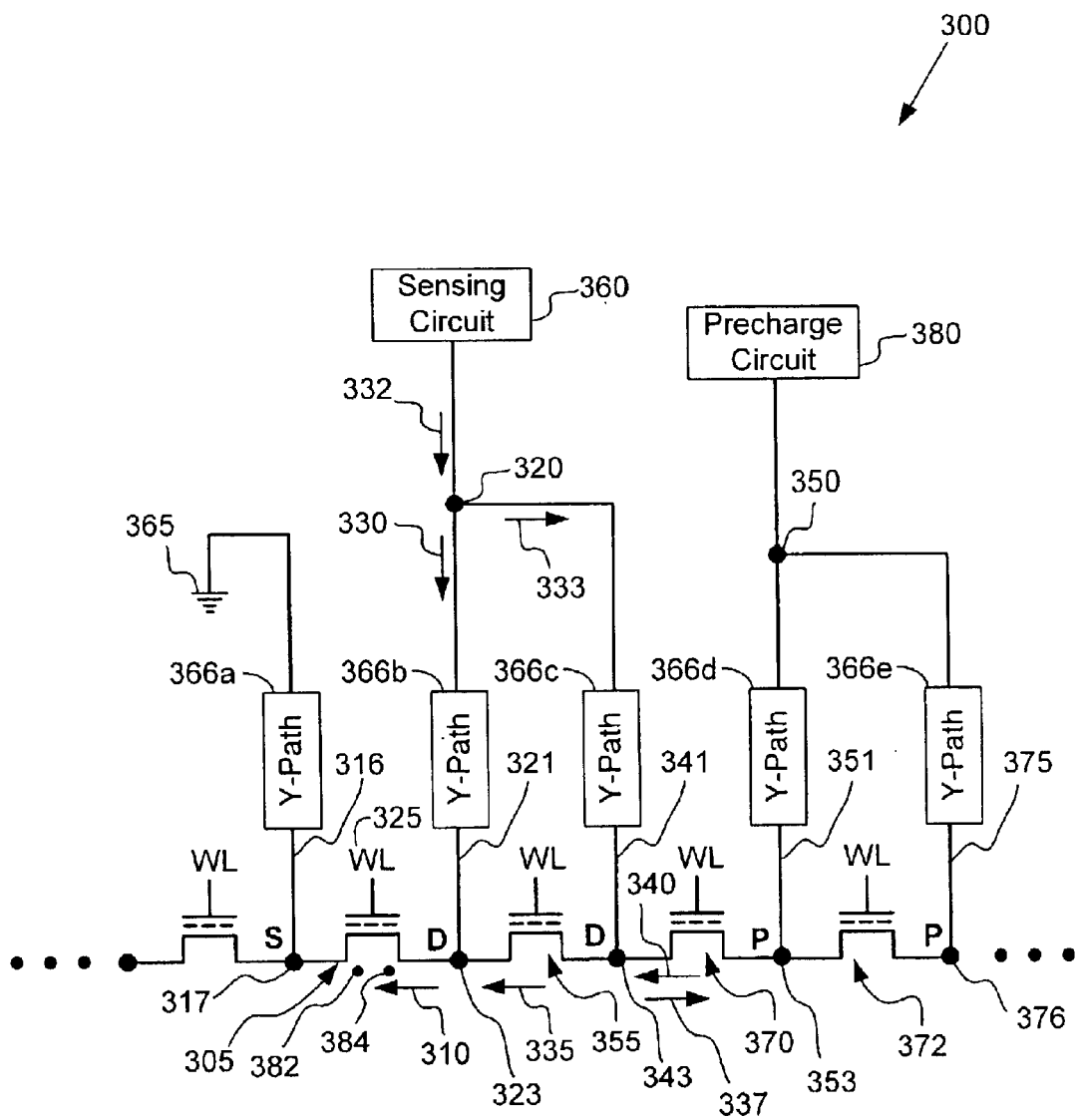
FIG. 3 depicts a circuit schematic of one embodiment of a memory circuit arrangement in accordance with the present invention.

Referring now to FIG. 3, there is shown a circuit schematic of one embodiment of a memory circuit arrangement 300 in accordance with the present invention which results in increased error margins in a fast and accurate manner during memory read operations. The present invention is suitable for use with memory cells capable of storing two binary bits, a "left" bit and a "right" bit, as illustrated in the present exemplary embodiment. The left bit can represent a "0" or a "1" while the right bit can represent a "0" or a "1" independent of the left bit. However, the present invention is also suitable for use with other types of memory cells, such as those storing only a single bit, for example. Y-Paths 366a through 366e as shown in FIG. 3 and described below can be represented by Y-Path 166 as shown in FIG. 1B and described above.

Memory circuit arrangement 300 depicts a portion of a memory device including adjacent memory cells 305, 355, 370 and 372 along the same word line 325 (designate "WL" in FIG. 3). In the particular embodiment depicted in FIG. 3, memory circuit arrangement 300 depicts an exemplary arrangement when a read operation involving left bit 382 of memory cell 305 is to be performed. Although not described herein for brevity, a similar memory circuit arrangement (not shown) can be implemented in accordance with the present invention when a read operation involving right bit 384 of memory cell 305 is to be performed. In the present application, memory cell 305, on which a read operation is to be performed, is also referred to as a "target cell" while each memory cell 355, 370, and 372 adjacent to memory cell 305 is also referred to as a "neighboring cell."

In memory circuit arrangement 300, bit line 316 is configured as the "source" bit line (designated "S" in FIG. 3) of memory cell 305 by coupling node 317 to ground 365 through Y-Path 366a. Bit line 321 is configured as the "drain" bit line (designated "D" in FIG. 3) of memory cell 305 by connecting node 323 to node 320 through Y-Path 366b, where sensing circuit 360 is connected at node 320. Word line 325 is connected to the gate terminal of memory cell 305 and is utilized to activate memory cell 305 during a read operation. In the present example, when memory cell 305 is activated, the amount of current 310 drawn by memory cell 305 indicates the "programmed" or "erase" status of left bit 382 of memory cell 305.

Memory cell 355 neighbors memory cell 305 and shares bit line 321 with memory cell 305 at node 323. According to the present invention, bit line 341 of memory cell 355 is configured as a drain bit line. More specifically, in memory circuit arrangement 300, node 343 of bit line 341 is connected to node 320 through Y-Path 366c. Since bit line 321 connected to node 320 is configured as a drain bit line, bit line 341, being connected to node 320, is also configured as a drain bit line and is also connected to sensing circuit 360 through Y-Path 366c. When left bit 382 of memory cell 305 is an erased bit (corresponding to a "1" bit) and neighbor memory cell 355 is an erased cell (corresponding to a "1"), leakage current 335 through neighbor memory cell 355 is largely equivalent to current 333 from node 320 to node 343. Thus, any reduction in current 330 due to leakage current 335 is substantially recovered since current 333 is added to current 330 though the connection of node 343 and node 320, such that total current 332 being sensed by sensing circuit 360 remains unchanged. The recovery of the leakage current through this technique results in a significantly increased read error margin when sensing the state of left bit 382 of memory cell 305. Using the exemplary reference current value of 15 μA, suppose memory cell current 310 is about 21 μA when memory cell 305 is an erased cell, and leakage current 335 through memory cell 355 is approximately 6 μA. In this case, current 330 corresponds to memory cell current 310 minus leakage current 335 and is about 15 μA. Current 333 would be about 5 μA and leakage current 340 flowing from neighboring cell 370 is approximately 1 μA. Thus, total current 332 detected by sensing circuit 360 would correspond to current 330 (15 μA) plus current 333 (5 μA) and would be approximately 20 μA and is very close to current 310 drawn by left bit 382 of memory cell 305. In addition, the desired error margin of approximately 5 μA above the reference current of 15 μA is provided.

Memory cell 370 neighbors memory cell 355 and shares bit line 341 with memory cell 355 at node 343. In the particular embodiment of FIG. 3, bit line 351 of memory cell 370 is configured as a "precharge" bit line (designated "P" in FIG. 3) by connecting node 353 to node 350 through Y-Path 366d, where node 350 is connected to precharge circuit 380. Memory cell 372 neighbors memory cell 370 and shares bit line 351 with memory cell 370 at node 353. Bit line 375 of memory cell 372 is also configured as a "precharge" bit line in this particular embodiment by connecting node 376 to node 350 through Y-Path 366e. By way of example, precharge circuit 380 may provide at nodes 353 and 376 a voltage at about the same level as that provided at node 343 through Y-Path 366c by sensing circuit 360. With this configuration, the precharge voltage at nodes 353 and 376 greatly reduces leakage current 337 through memory cell 370 (i.e., from node 343 to node 353) when left bit 382 of memory cell 305 is a programmed bit (corresponding to a "0" bit) and when neighboring memory cell 370 and all its neighboring cells between memory cell 370 and ground are erased cells (corresponding to a "1" bits), and/or when leakage current 337 is drawn through memory cell 370 due to transient current that could be present for charging some of the bit lines for memory cells situated on the right side of memory cell 372 in FIG. 3. Leakage current 337 is reduced because by providing additional precharge voltage to the right side of node 353 at node 376, node 353 is significantly less affected by the ground path and/or transient current path to the right side of node 376. In effect, the voltage at node 376 acts to buffer the voltage at node 353 from the ground path and/or transient current path to the right side of node 376. Since node 353 is less affected by the ground path and/or transient current path to the right side of node 376, voltage at node 353 is close to the voltage at node 343, and thus, current 337 is significantly reduced. Therefore, total current 332 detected by sensing circuit 360 is very close to current 310 drawn by left bit 382 of memory cell 305, since leakage currents 337 is greatly reduced. In addition, the error margin loss is greatly reduced due to memory circuit arrangement 300 in either the case where left bit 382 of memory cell 305 is a programmed bit or an erased bit, even when the neighboring memory cells 355, 370, 372 are erased cells. Accordingly, comparison of current 332 against a reference current (not shown) can be made with greater accuracy and reliability during a read operation involving left bit 382 of memory cell 305.

As illustrated in the exemplary embodiment of FIG. 3, an additional "drain" bit line (e.g., bit line 341) configured for at least one adjacent neighboring memory cell (e.g., memory cell 355) to the memory cell to be read (e.g., memory cell 305) reduces the error margin loss when the bit of the memory cell to be read is an erased bit, and where bits associated with neighboring memory cells are erased bits. On the other hand, additional "precharge" bit lines (e.g., bit lines 351 and 375) configured for other adjacent neighboring memory cells (e.g., memory cells 370 and 372) reduces the error margin loss when the bit of the memory cell to be read is a programmed bit, and where bits associated with neighboring memory cells are erased bits.

Figure 4:
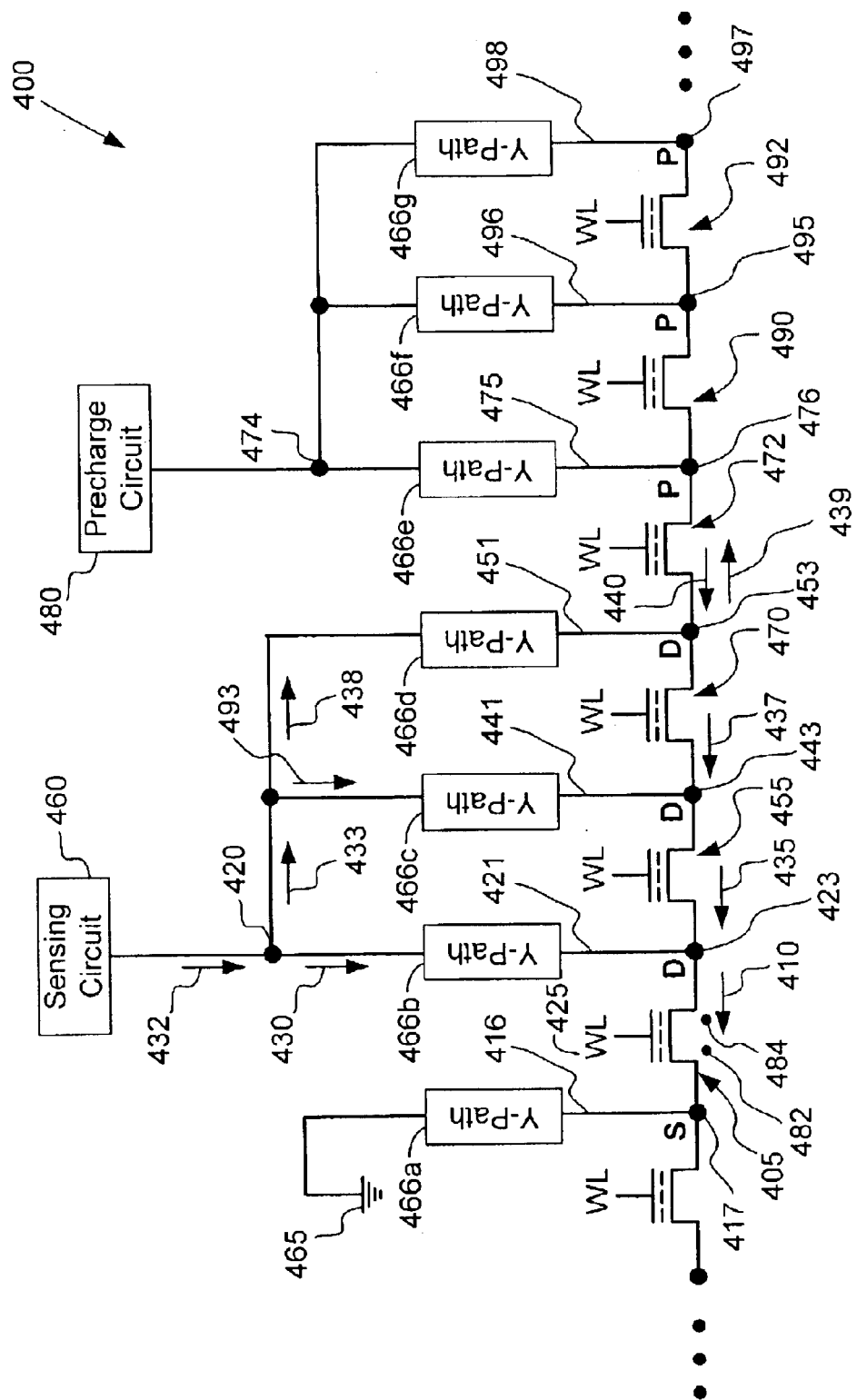
FIG. 4 depicts a circuit schematic of another embodiment of a memory circuit arrangement in accordance with the present invention.

Referring now to FIG. 4, there is shown a circuit schematic of another embodiment of the invention as memory circuit arrangement 400. Memory circuit arrangement 400 depicts a portion of a memory device including adjacent memory cells 405, 455, 470, 472, 490 and 492 along the same word line (designate "WL" in FIG. 4) 425. The particular embodiment shown in FIG. 4 depicts an exemplary arrangement when a read operation involving left bit 482 of memory cell 405 is to be performed. A similar memory circuit arrangement (not shown) can be implemented in accordance with the present invention when a read operation involving right bit 484 of memory cell 405 is to be performed. In the present application, memory cell 405, on which a read operation is to be performed, can be referred to as a "target cell" while each memory cell 455, 470, 472, 490, and 492 adjacent to memory cell 405 can be referred to as a "neighboring cell." Y-Paths 466a through 466g as shown in FIG. 4 and described below can be represented by Y-Path 166 as shown in FIG. 1B and described above.

In memory circuit arrangement 400, bit line 416 is configured as the "source" bit line (designated "S" in FIG. 4) of memory cell 405 by coupling node 417 to ground 465 through Y-Path 466a. Bit line 421 is configured as the "drain" bit line (designated "D" in FIG. 4) of memory cell 405 by connecting node 423 to node 420 through Y-Path 466b, where node 420 is connected to sensing circuit 460. Word line 425 is connected to the gate terminal of memory cell 405 and is utilized to activate memory cell 405 during a read operation. In the present example, when memory cell 405 is activated, the amount of current 410 drawn by memory cell 405 indicates the "programmed" or "erased" status of memory left bit 482 of memory cell 405.

In the particular embodiment depicted FIG. 4, bit lines 441 and 451 of memory cells 455 and 470, respectively, are configured as "drain" bit lines. As such, node 443 of bit line 441 and node 453 of bit line 451 are connected at node 420.to sensing circuit 460 through Y-Paths 466c and 466d, respectively. By further configuring bit lines 441 and 451 as "drain" bit lines in memory circuit arrangement 400, current 432 more accurately represents memory cell current 410 associated with left bit 482 of memory cell 405, and further results in reduced error margin loss, particularly when left bit 482 of memory cell 405 is an erased bit (corresponding to a "1" bit) and memory cells 455 and 470 are erased cells (each corresponding to a "1"). The reason is that current 433 is added to current 430 to form total current 432, thereby compensating for leakage current 435. Furthermore, current 438 is added to current 493 to form current 433, thereby compensating for leakage current 437. The magnitude of any additional leakage current through neighboring memory cells, e.g., current 440 through memory cell 472, is very small compared to current 410 drawn by memory cell 410, and therefore, such additional leakage current has less of an impact on total current 432. Thus, total current 432 detected by sensing circuit 460 is very close to current 410 drawn by left bit 482 of memory cell 405 due to compensation for leakage currents 435 and 437. In addition, the desired error margin of approximately 5 μA above the reference current of 15 μA is provided.

In the particular embodiment of FIG. 4, bit lines 475, 496 and 498 of memory cells 472, 490 and 492, respectively, are configured as "precharge" bit lines (designated "P" in FIG. 4). As such, node 476 of bit line 475, node 495 of bit line 496, and node 497 of bit line 498 are connected at node 474 to precharge circuit 480 through Y-Paths 466e, 466f and 466g, respectively. By way of example, precharge circuit 480 may supply at nodes 476, 495 and 497 a voltage at about the same level as that provided at node 453 through Y-Path 466d by sensing circuit 460. With this configuration, the precharge voltages at nodes 476, 495 and 497 greatly reduce leakage current 439 through memory cell 472 (i.e., from node 453 to node 476), particularly when left bit 482 of memory cell 405 is a programmed bit (corresponding to a "0" bit) and when memory cell 472 and all its neighboring cells between memory cell 472 and ground are erased cells (corresponding to a "1" bits), and/or when leakage current 439 is drawn through memory cell 472 due to transient current that could be present for charging some of the bit lines for memory cells situated on the right side of memory cell 492 in FIG. 4. Leakage current 439 is reduced because by providing additional precharge voltages to the right side of node 476, i.e., at nodes 495 and 497, node 476 is significantly less affected by the ground path and/or transient current path to the right side of node 497. In effect, the voltages at nodes 495 and 497 act to buffer the voltage at node 476 from the ground path and/or transient current path to the right side of node 497. Since node 476 is less affected by the ground path and/or transient current path to the right side of node 497, voltage at node 476 is close to the voltage at node 453, and thus, current 439 is significantly reduced. Thus, total current 432 detected by sensing circuit 460 is very close to memory cell current 410 drawn by memory cell 405, since leakage current 439 is greatly reduced.

As a result, the error margin loss is greatly reduced due to memory circuit arrangement 400 in either the case where left bit 482 of memory cell 405 is a programmed bit or an erased bit, even when neighboring memory cells 455, 470, 472, 490, and 492 are erased cells. Accordingly, comparison of current 432 against a reference current (not shown) can be made with greater accuracy and reliability during a read operation involving left bit 482 of memory cell 405.

Memory circuit arrangement 400 of FIG. 4 provides better accuracy over memory circuit arrangement 300 of FIG. 3 due to the addition of third "drain" bit line 451 and a third "precharge" bit line 498, but at the expense of additional power consumption and access speed. Accordingly, in other embodiments of the present invention, the number of "drain" bit lines and/or "precharge" bit lines may be selected in accordance with a particular desired accuracy, power budget, and access speed.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, the specific number of "drain" bit lines and "precharge" bit line can be modified without departing from the scope of the present invention, as noted above. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a circuit for accurate memory read operations has been described.

We claim:

1. A memory circuit arrangement for sensing current in a target cell during a read operation, said memory circuit arrangement comprising:

said target cell having a first bit line connected to ground, said target cell having a second bit line connected to a sensing circuit;

a first neighboring cell adjacent to said target cell, said first neighboring cell sharing said second bit line with said target cell, said first neighboring cell having a third bit line connected to said sensing circuit during said read operation.

2. The memory circuit arrangement of claim 1 further comprising a second neighboring cell adjacent to said first neighboring cell, said second neighboring cell sharing said third bit line with said first neighboring cell, said second neighboring cell having a fourth bit line connected to a precharge circuit during said read operation.

3. The memory circuit arrangement of claim 2 further comprising a third neighboring cell adjacent to said second neighboring cell, said third neighboring cell sharing said fourth bit line with said second neighboring cell, said third neighboring cell having a fifth bit line connected to said precharge circuit during said read operation.

4. The memory circuit arrangement of claim 1 wherein each of said target cell and said first neighboring cell comprises a respective gate terminal connected to a common word line.

5. The memory circuit arrangement of claim 2 wherein each of said target cell, said first neighboring cell, and said second neighboring cell comprises a respective gate terminal connected to a common word line.

6. The memory circuit arrangement of claim 3 wherein each of said target cell, said first neighboring cell, said second neighboring cell, and said third neighboring cell comprises a respective gate terminal connected to a common word line.

7. The memory circuit arrangement of claim 1 wherein said target cell stores a first bit and a second bit.

8. A memory circuit arrangement comprising:

target cell means for storing at least one bit, said target cell means having a first bit line connected to ground, said target cell means having a second bit line connected to a sensing circuit;

first neighboring cell means for storing at least one bit, said first neighboring cell means sharing said second bit line with said target cell means, said first neighboring cell means having a third bit line connected to said sensing circuit during a read operation.

9. The memory circuit arrangement of claim 8 further comprising second neighboring cell means for storing at least one bit, said second neighboring cell means adjacent to said first neighboring cell means, said second neighboring cell means sharing said third bit line with said first neighboring cell means, said second neighboring cell means having a fourth bit line connected to a precharge circuit during said read operation.

10. The memory circuit arrangement of claim 9 further comprising third neighboring cell means for storing at least one bit, said third neighboring cell means adjacent to said second neighboring cell means, said third neighboring cell means sharing said fourth bit line with said second neighboring cell means, said third neighboring cell means having a fifth bit line connected to said precharge circuit during said read operation.

11. The memory circuit arrangement of claim 8 wherein each of said target cell means and said first neighboring cell means comprises a respective gate terminal connected to a common word line.

12. The memory circuit arrangement of claim 9 wherein each of said target cell means, said first neighboring cell means, and said second neighboring cell means comprises a respective gate terminal connected to a common word line.

13. The memory circuit arrangement of claim 10 wherein each of said target cell means, said first neighboring cell means, said second neighboring cell means, and said third neighboring cell means comprises a respective gate terminal connected to a common word line.

14. The memory circuit arrangement of claim 8 wherein said target cell means stores a first bit and a second bit.

15. A memory circuit arrangement for sensing current in a target cell during a read operation, said memory circuit arrangement comprising said target cell having a first bit line connected to ground, said target cell having a second bit line connected to a sensing circuit, said memory circuit arrangement being characterized by:

a first neighboring cell adjacent to said target cell, said first neighboring cell sharing said second bit line with said target cell, said first neighboring cell having a third bit line connected to said sensing circuit during said read operation.

16. The memory circuit arrangement of claim 15 further comprising a second neighboring cell adjacent to said first neighboring cell, said second neighboring cell sharing said third bit line with said first neighboring cell, said second neighboring cell having a fourth bit line connected to a precharge circuit during said read operation.

17. The memory circuit arrangement of claim 16 further comprising a third neighboring cell adjacent to said second neighboring cell, said third neighboring cell sharing said fourth bit line with said second neighboring cell, said third neighboring cell having a fifth bit line connected to said precharge circuit during said read operation.

18. The memory circuit arrangement of claim 15 wherein each of said target cell and said first neighboring cell comprises a respective gate terminal connected to a common word line.

19. The memory circuit arrangement of claim 16 wherein each of said target cell, said first neighboring cell, and said second neighboring cell comprises a respective gate terminal connected to a common word line.

20. The memory circuit arrangement of claim 17 wherein each of said target cell, said first neighboring cell, said second neighboring cell, and said third neighboring cell comprises a respective gate terminal connected to a common word line.

* * * * *